(12) United States Patent
Issa

(10) Patent No.: US 6,650,563 B2
(45) Date of Patent: Nov. 18, 2003

(54) COMPACT AND HIGHLY EFFICIENT DRAM CELL

(75) Inventor: Sami Issa, Phoenix, AZ (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 10/128,328

(22) Filed: Apr. 23, 2002

(65) Prior Publication Data

US 2003/0198076 A1 Oct. 23, 2003

(51) Int. Cl.[7] .............................................. G11C 11/24
(52) U.S. Cl. ................... 365/149; 365/185.26
(58) Field of Search ................ 365/149, 185.26; 257/298

(56) References Cited

U.S. PATENT DOCUMENTS 4,612,629 A * 9/1986 Harari ................... 365/185.08
5,712,817 A * 1/1998 Suh ....................... 365/185.08
6,362,502 B1 * 3/2002 Rosner et al. .............. 365/149

* cited by examiner

Primary Examiner—Huan Hoang
(74) Attorney, Agent, or Firm—McAndrews, Held & Malloy, Ltd.

(57) ABSTRACT

A compact dynamic random access memory (DRAM) cell and highly efficient methods for using the DRAM cell are disclosed. The DRAM cell provides reading, writing, and storage of a data bit on an ASIC chip. The DRAM cell includes a first transistor acting as a pass gate and having a first source node, a first gate node, and a first drain node. The DRAM cell also includes a second transistor acting as a storage device and having a second drain node that is electrically connected to the first drain node to form a storage node. The second transistor also includes a second source node and a second gate node. The second source node is electrically floating, thus increasing the effective storage capacitance of the storage node.

37 Claims, 6 Drawing Sheets

TWO-CELL LAYOUT

COMPACT AND HIGHLY EFFICIENT DRAM CELL

BACKGROUND OF THE INVENTION

Certain embodiments of the present invention afford an efficient approach for using a compact DRAM cell to reduce the leakage current when storing a data bit in the DRAM cell. In particular, certain embodiments provide a compact DRAM cell having a storage node formed by electrically connecting the drain nodes of two transistors in the DRAM cell.

Dynamic RAM is a type of memory that keeps its contents only if supplied with regular clock pulses and a chance to periodically refresh the stored data internally. DRAM is much less expensive than static RAM (which needs no refreshing) and is the type found in most personal computers and other digital applications.

DRAM storage cells may be formed from two elements, usually a transistor and a capacitor. A major reduction in storage cell area is achieved with such a configuration. As a result, DRAM is an attractive option for custom and semi-custom chips.

Highly integrated System-on-Chip (SOC) implementations require high density and efficient embedded memory. Embedded DRAM memory has the potential to offer high density, low power, and high speed required for state-of-the-art chip designs. Costs associated with integrating embedded DRAM remain a significant factor that slows the integration and adoption of DRAM memory for a wide range of applications including next-generation handsets and high-speed networking.

A DRAM cell configuration having high storage capacity and low leakage current that uses generic fabrication processes, requiring no additional masks, is desired. Reducing leakage current maximizes retention time which means reducing the number of times per second a data bit needs to be refreshed in a storage node so the data bit is not lost. The more often the data bits must be refreshed, the higher the required power and the less the dependability of the data bits.

Further limitations and disadvantages of conventional and traditional approaches will become apparent to one of skill in the art, through comparison of such systems with embodiments of the present invention as set forth in the remainder of the present application with reference to the drawings.

BRIEF SUMMARY OF THE INVENTION

An embodiment of the present invention provides a compact and highly efficient DRAM cell configuration embedded on an ASIC chip. The DRAM cell provides reading, writing, and storage of a data bit on an ASIC chip. The DRAM cell includes a first transistor acting as a pass gate and having a first source node, a first gate node, and a first drain node. The DRAM cell also includes a second transistor acting as a storage device and having a second drain node that is electrically connected to the first drain node to form a storage node. The second transistor also includes a second source node and a second gate node. The second source node is electrically floating, thus increasing the effective storage capacitance of the storage node.

A method of the present invention provides the highly efficient use of a compact DRAM cell configuration by reducing leakage current when storing a data bit in the DRAM cell. The method includes writing a data bit to the DRAM cell during a first time segment and storing the data bit during a second time segment. During the second time segment, a transistor disabling reference ground potential is applied to a first gate node of a first transistor of the DRAM cell. A first reference voltage is also applied to a first source node of the first transistor during the second time segment. A second reference voltage is applied to a second gate node of a second transistor during at least a portion of the second time segment. The second reference voltage is more positive than the first reference voltage. The second source node is electrically floating to increase the effective storage capacitance of the storage node of the DRAM cell.

Certain embodiments of the present invention afford an efficient approach for using a compact DRAM cell to reduce the leakage current when storing a data bit in the DRAM cell.

DETAILED DESCRIPTION OF THE INVENTION

Figure 1:
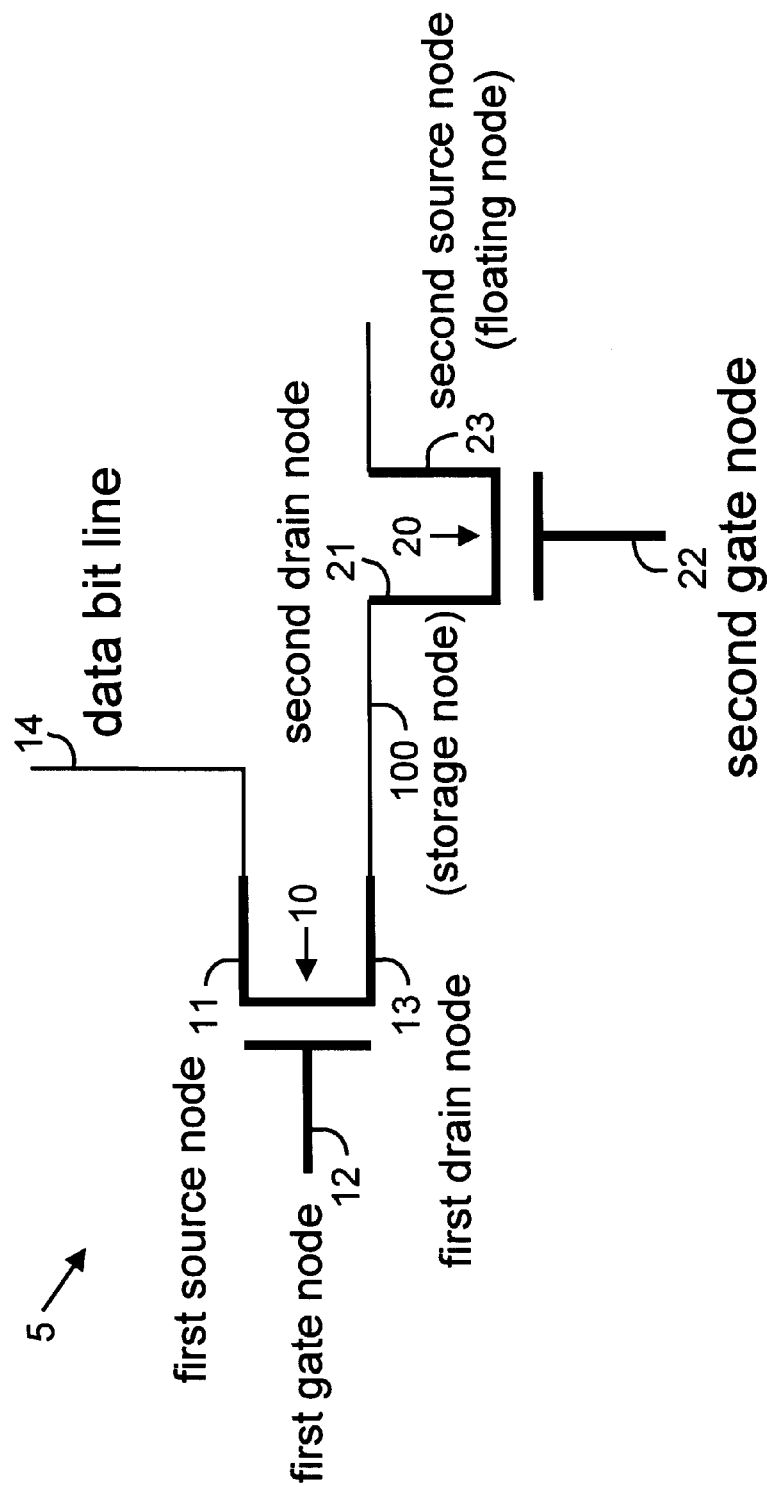
FIG. 1 is a schematic block diagram of a DRAM cell configuration in accordance with an embodiment of the present invention.

FIG. 1 is a schematic block diagram of a DRAM cell configuration 5 in accordance with an embodiment of the present invention. The DRAM cell 5 includes a pass transistor 10 and a storage transistor 20. The pass transistor 10 acts as a pass gate to enable reading and writing of a data bit. A data bit line 14 connects to the source node 11 of the pass transistor 10. A read/write enable line connects to the gate node 12 of the pass transistor 10.

A storage node 100 is formed by the connection of the drain node 13 of the pass transistor 10 and the drain node 21 of the storage transistor 20. A bias voltage is applied to the gate node 22 of the storage transistor 20. The source node 23 of the storage transistor 20 is left floating. The capacitance associated with the storage transistor 20 allows the storage transistor 20 to act as a storage device for a data bit.

Figure 1A:
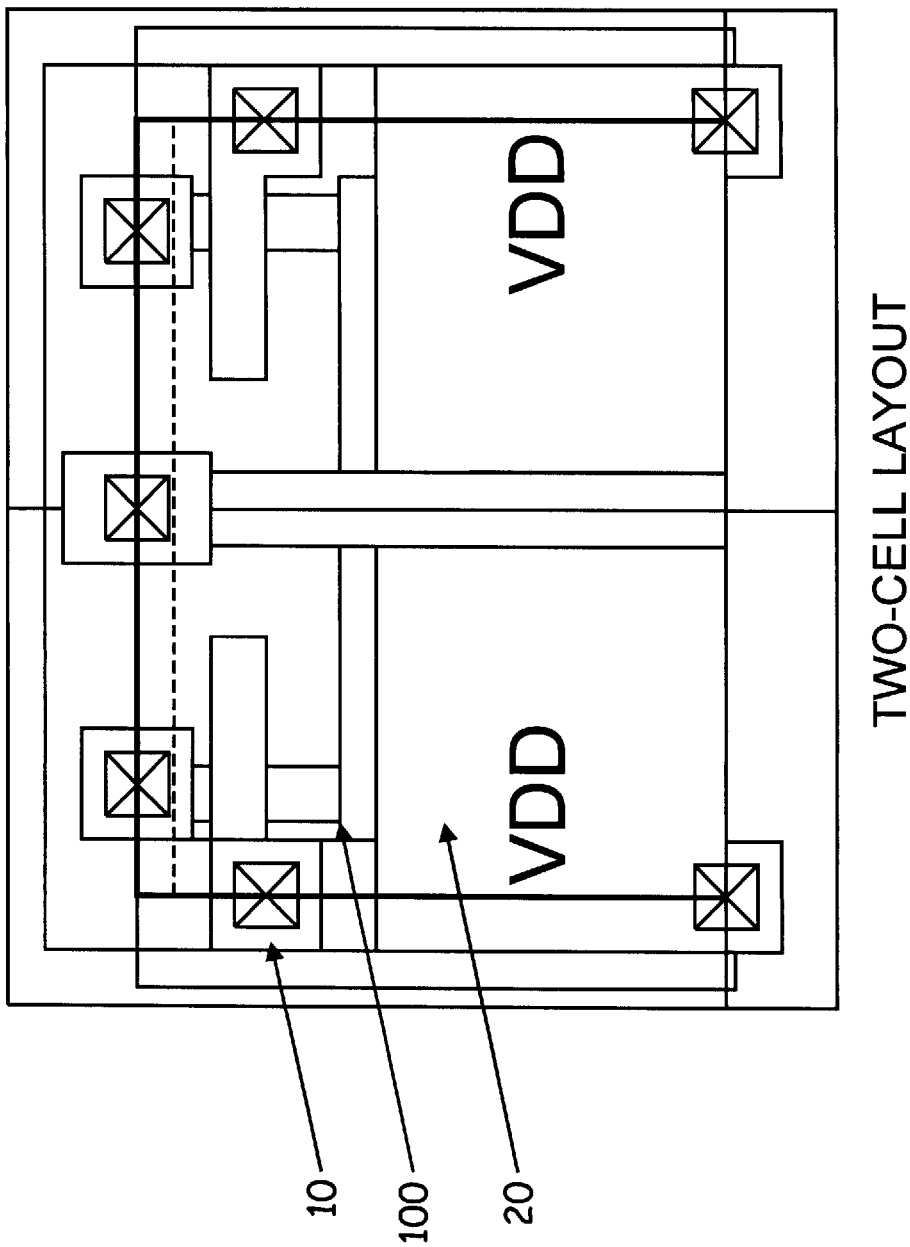
FIG. 1A illustrates a two-cell layout of the DRAM cell configuration of FIG. 1 in accordance with an embodiment of the present invention.

By sharing the drain nodes between the pass transistor 10 and the storage transistor 20, the space available for the storage node may be increased when the DRAM cell is implemented on a chip using embedded CMOS technology. As a result, the effective storage capacitance is increased. FIG. 1A illustrates a two-cell layout of the DRAM cell configuration of FIG. 1 in accordance with an embodiment of the present invention.

The pass transistor 10 and the storage transistor 20 are field-effect-transistors (FETs). The capacitance provided by the storage FET 20 is due to a junction capacitance of the storage FET 20 and an oxide layer of the floating source node of the storage FET 20. The two capacitances create an effective storage node capacitance that is used to store a data bit. The sharing of the diffusion of the drain nodes of the two FETs on a CMOS chip allows the effective storage capacitance to be increased.

Figure 2:
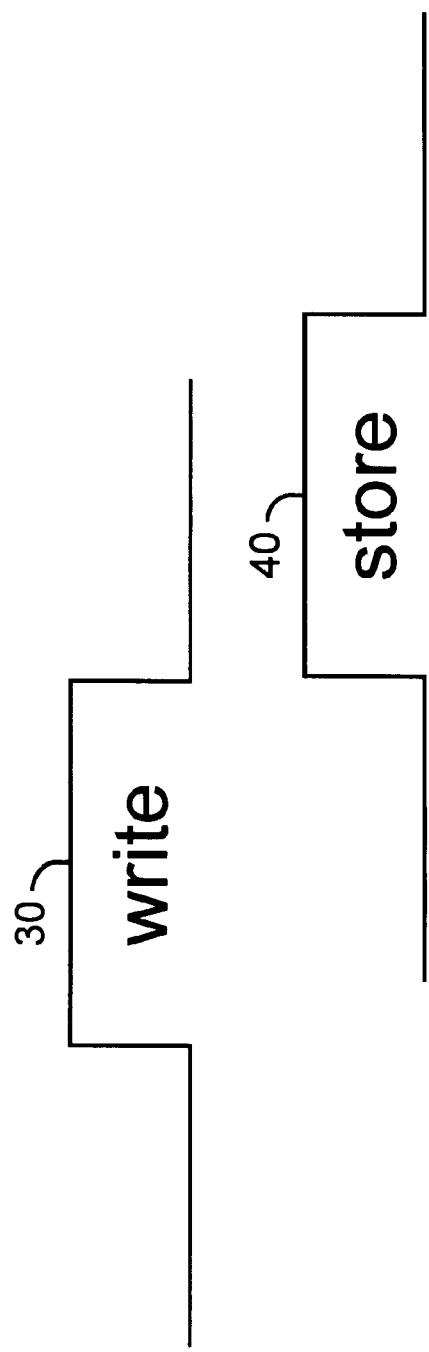
FIG. 2 is an exemplary timing diagram illustrating a write time segment followed by a store time segment in accordance with an embodiment of the present invention.

FIG. 2 is an exemplary timing diagram illustrating a write time segment 30 followed by a store time segment 40 in accordance with an embodiment of the present invention. During the write time segment 30, a data bit is written to the storage node 100 of the DRAM cell. Writing of the data bit is accomplished by applying a data bit voltage to the source node 14 of the pass FET 10. A read/write-enabling voltage is applied to the gate node 12 of the pass FET 10. A bias voltage of the same level as the read/write voltage is applied to the gate node 22 of the storage FET 20.

During the store time segment 40, the gate node 12 is brought to an electrical ground potential to turn off the pass gate 10 after the write time segment when the storage node is charged up. The data bit line 14 is put at a voltage reference level of $V_{DD}$. A bias voltage is applied to gate node 22 of the storage FET 20 during the store time segment.

During the store time segment 40, a leakage current develops within the cell 5 due to the flow of current from the $V_{DD}$ potential of the data bit line 14 to the potential of the storage node 100. When the data bit stored at storage node 100 is a logic "1", the voltage stored at node 100 is at or very near the $V_{DD}$ potential. As a result, the potential difference between data bit line 14 and the storage node 100 is small and the leakage current is small and does not significantly affect the stored potential at storage node 100.

However, when the data bit stored is a logic "0", the leakage current is significantly higher and may charge up the storage node toward a logic "1" potential much more quickly after the logic "0" is written to the cell. For example, when the bias voltage applied to gate node 22 is $V_{DD}$ during the store time segment 40 and a logic "0" (zero volts) is being stored at storage node 100, then the leakage current between the data bit line 14 and the storage node 100 may cause the logic "0" potential to charge up to a logic "1" potential in about 1 microsecond. As a result, the logic "0" would have to be written again to the cell, or refreshed, within the 1 microsecond time interval.

Figure 3:
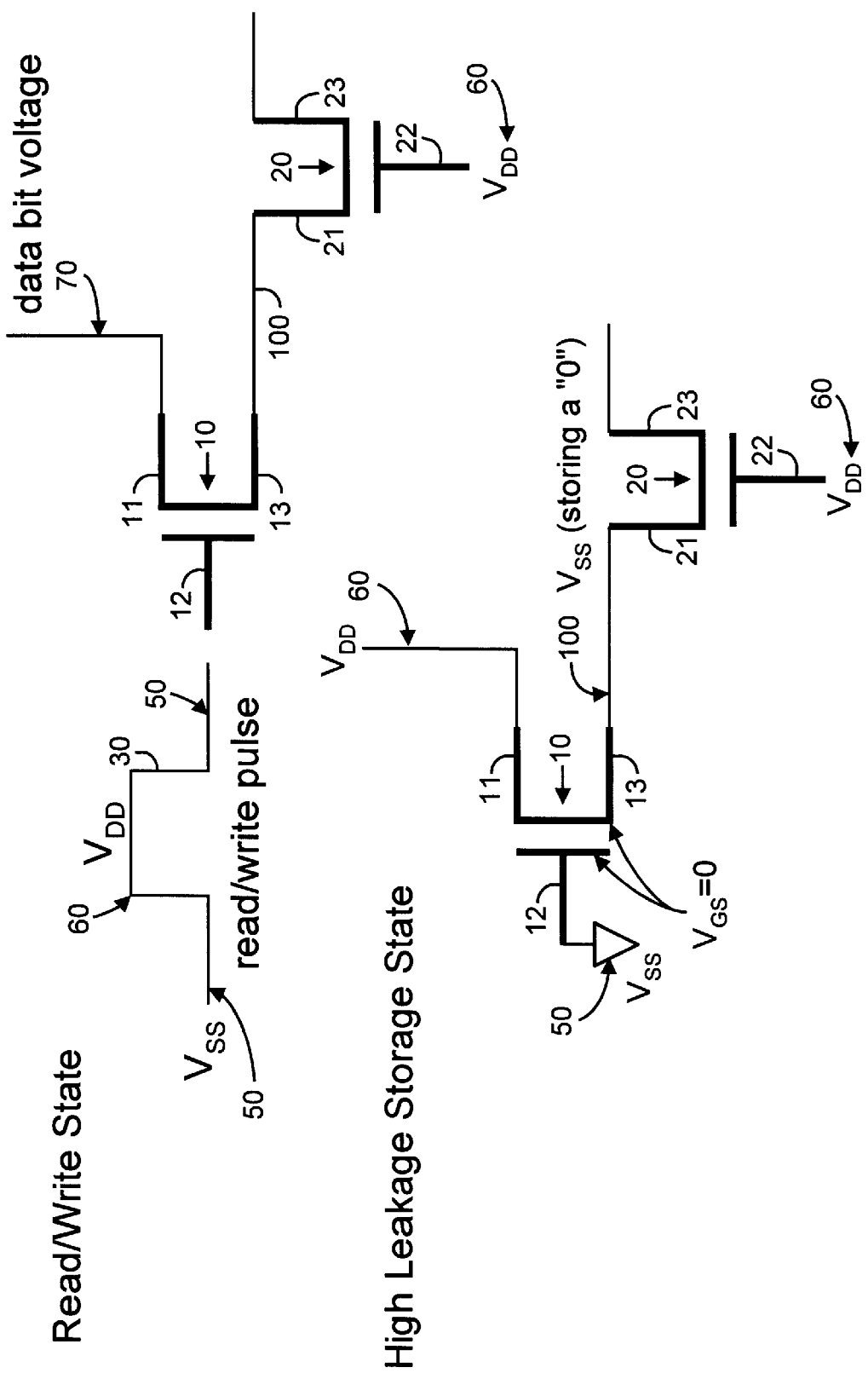
FIG. 3 is a schematic block diagram illustrating an undesirable read/write state and resultant high leakage storage state of the DRAM cell configuration of FIG. 1.

FIG. 3 illustrates the case where $V_{DD}$ 60 is applied to gate node 22 during both the write time segment 30 and the store time segment 40. During the write time segment (read/write state of the cell) a voltage level of $V_{DD}$ 60 is applied to gate node 12 to enable pass FET 10. The logic "0" potential of zero volts 70 on data bit line 14 is written to storage node 100. Once the logic "0" is written to the cell, the logic "0" potential is stored by disabling the pass FET 10 by applying a ground reference potential $V_{ss}$ 50 of zero volts to the gate node 12. A reference potential of $V_{DD}$ 60 is applied to data bit line 14. The potential difference between the data bit line 14 and the storage node 100 is then $V_{DD}$ 60 and the potential difference between the gate node 12 and the storage node 100 is zero. Since the gate node 22 is still at $V_{DD}$ 60, the storage node 100 tends to charge up quickly, in about 1 microsecond, to a logic "1", $V_{DD}$, due to the leakage current through the cell.

Figure 4:
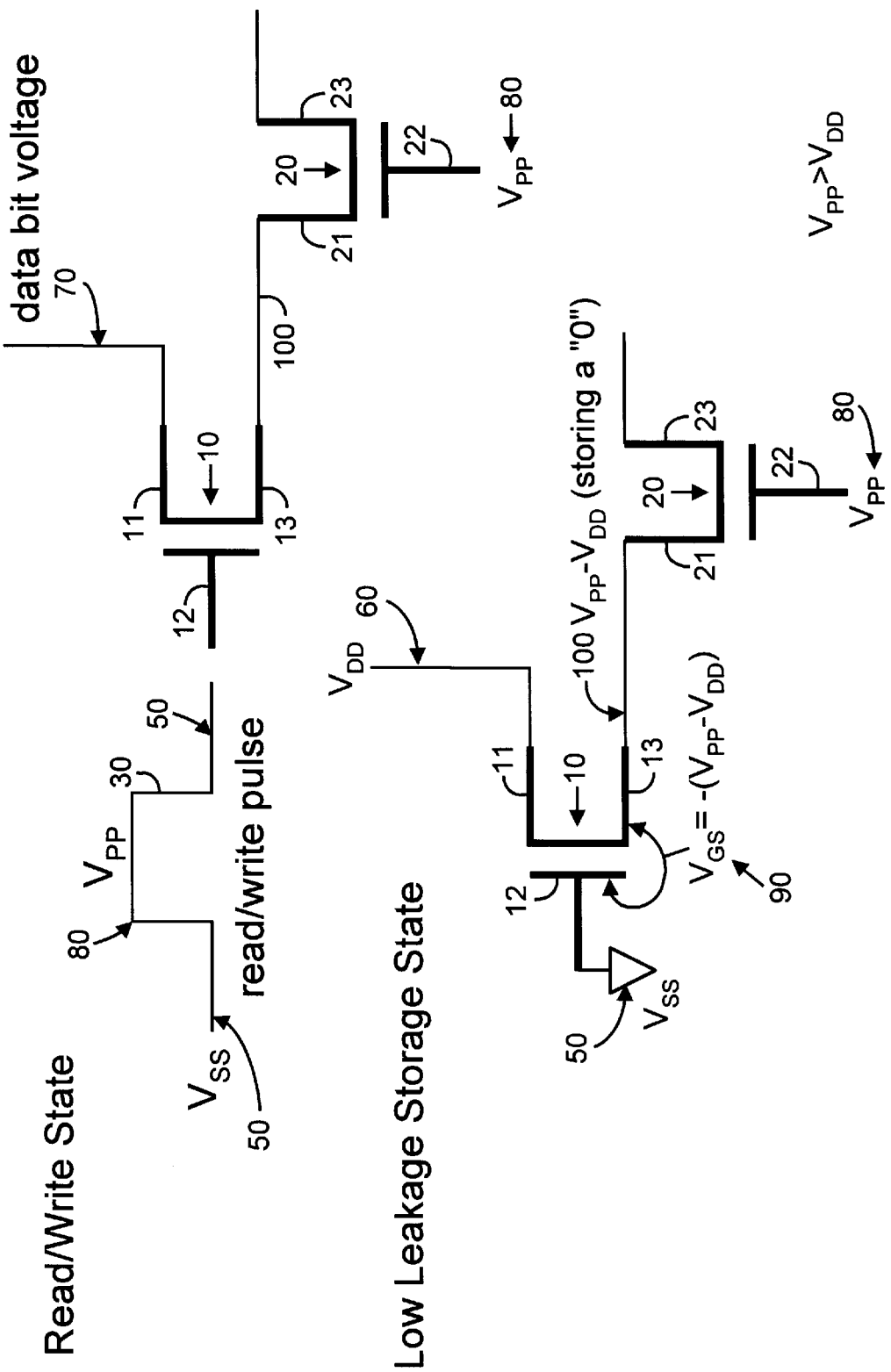
FIG. 4 is a schematic block diagram illustrating a first method of writing to the DRAM cell configuration of FIG. 1 and storing a data bit in accordance with an embodiment of the present invention.

FIG. 4 illustrates a method, according to an embodiment of the present invention, to increase the time it takes to charge up the storage node by a factor of about 100, thus reducing the frequency of updating or refreshing the storage node when storing a logic "0". During the write time segment 30 (read/write state), a read/write enabling voltage $V_{PP}$ 80, which is more positive than $V_{DD}$ 60, is applied to the gate node 12 of pass FET 10. The gate node 22 is also at $V_{PP}$ 80 during the write time segment 30 and is kept at $V_{PP}$ during the store time segment 40. The data bit line 14 is again at $V_{DD}$ during the store time segment 40. As a result, the voltage stored at the storage node 100 is ($V_{PP}-V_{DD}$) and is greater than zero since $V_{PP}$ is greater than $V_{DD}$. Therefore, the potential difference between the data bit line 14 and the storage node 100 is ($V_{DD}-(V_{PP-VDD})$) which is less than it was in the previous case.

The leakage current is reduced as a result of the higher potential of the storage node 100. Instead of the storage node 100 charging up to a logic "1" in about 1 microsecond, it may now take about 100 microseconds when ($V_{PP}-V_{DD}$) is 200 millivolts. Again, the gate node 12 is at a reference ground potential $V_{SS}$ 50 of zero volts during store time segment 40. The voltage between the gate node 12 and the storage node 100 is $-(V_{PP}-V_{DD})$ 90.

Figure 5:
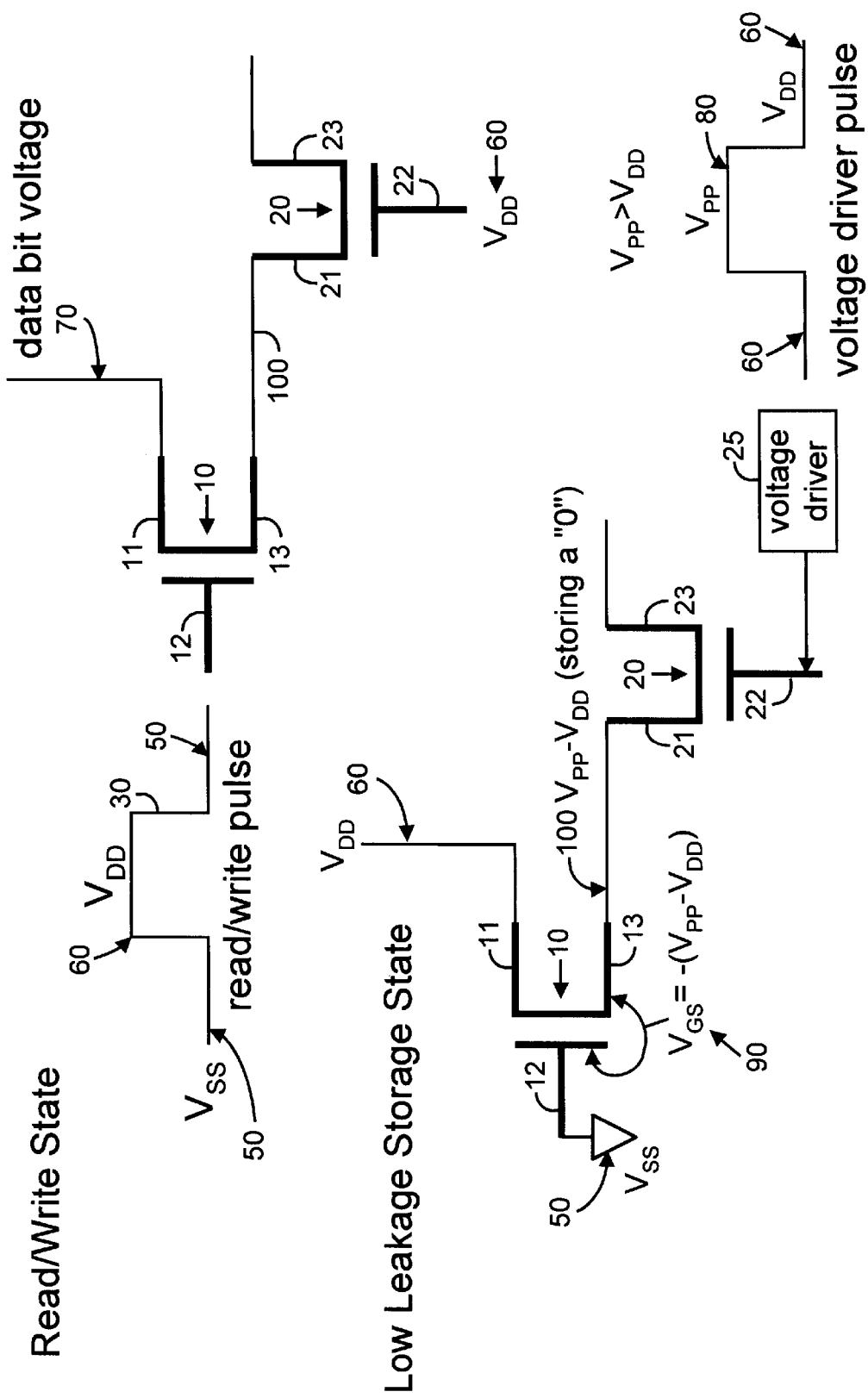
FIG. 5 is a schematic block diagram illustrating a second method of writing to the DRAM cell configuration of FIG. 1 and storing a data bit in accordance with an embodiment of the present invention.

As one possible alternative, instead of keeping the gate node 22 at $V_{PP}$ 80, the gate node 22 may be at $V_{DD}$ 60 during the write time segment 30 and pulsed to $V_{PP}$ during the store time segment 40 as illustrated in FIG. 5. A voltage driver 25 is used to provide the voltage pulse from $V_{DD}$ to $V_{PP}$ on gate node 22 during the store time segment 40. During the write time segment 30, the pass FET 10 is turned on by a read/write voltage which is at a voltage potential of $V_{DD}$ 60. After the data bit voltage 70 is written to the storage node 100, the voltage driver 25 pulses the node gate 22 from $V_{DD}$ to $V_{PP}$ to create a storage node potential of ($V_{PP}-V_{DD}$). As a result, the leakage current is reduced similarly to the case shown in FIG. 4 and the charge time is again extended to about 100 microseconds from 1 microsecond when ($V_{PP}-V_{DD}$) is 200 millivolts.

Applying a constant potential of $V_{PP}$ 80 during the write time segment and store time segment is easier to implement and does not require a voltage driver 25. However, using the voltage driver 25 and pulsing the gate node 22 allows finer control of the leakage current and, therefore, the frequency of storage node updates required.

The various elements of the DRAM cell 5 may be combined or separated according to various embodiments of the present invention. For example, the storage FET 20 and the voltage driver 25 may be integrated as a single embedded device or may be implemented as two separate embedded devices that are electrically connected through an embedded trace.

In summary, certain embodiments of the present invention afford an approach to obtain system on chip (SOC) integration of high density and efficient embedded memories. Embedded DRAM memories offer high density, low power and high speed required for state-of-the-art chip designs. Leakage currents of embedded DRAM cells are also reduced, increasing memory storage efficiency.

While the invention has been described with reference to certain embodiments, it will be understood by those skilled in the art that various changes may be made and equivalents may be substituted without departing from the scope of the invention. In addition, many modifications may be made to adapt a particular situation or material to the teachings of the invention without departing from its scope. Therefore, it is intended that the invention not be limited to the particular embodiment disclosed, but that the invention will include all embodiments falling within the scope of the appended claims.

What is claimed is:

1. A dynamic random access memory (DRAM) cell providing reading, writing, and storage of a data bit, said cell comprising:
   a first transistor having a first source node, a first gate node, and a first drain node; and
   a second transistor having a second drain node that is electrically connected to said first drain node, and said second transistor having a second source node that is electrically floating, and a second gate node that is connected to a bias voltage level.

2. The cell of claim 1 wherein said first transistor is a field-effect-transistor (FET) acting as a memory pass gate to read and write said data bit.

3. The cell of claim 1 wherein said second transistor is a FET acting as a memory storage for storing said data bit.

4. The cell of claim 1 wherein said first drain node and said second drain node, connected together, constitute a storage node.

5. The cell of claim 1 further comprising a pulsed voltage driver connected to said second gate node.

6. The cell of claim 1 wherein said first gate node comprises a memory read/write-enable line.

7. The cell of claim 1 wherein said first source node comprises a memory bit line that is written to and read from.

8. The cell of claim 1 wherein said first transistor and said second transistor comprise a memory cell embedded on an ASIC chip using CMOS technology.

9. The cell of claim 1 wherein said second transistor has a first storage capacitance associated with a junction of said second transistor and a second storage capacitance associated with an oxide layer of said second source node to store said data bit.

10. A method for reducing leakage current when storing a data bit in an embedded DRAM cell, said method comprising:
    writing a data bit to a DRAM cell during a first time segment;
    applying a transistor disabling reference ground potential to a first gate node of a first transistor of said DRAM cell during a second time segment, said second time segment being after said first time segment;
    applying a first reference voltage, with respect to said reference ground potential, to a first source node of said first transistor during said second time segment; and
    applying a second reference voltage, with respect to said reference ground potential, to a second gate node of a second transistor during at least a portion of said second time segment.

11. The method of claim 10 wherein said writing comprises:
    applying a data bit voltage to said first source node of said first transistor during said first time segment;
    applying a read/write-enabling voltage level, with respect to said reference ground potential, to said first gate node of said first transistor during said first time segment; and
    applying said read/write-enabling voltage level to said second gate node of said second transistor during at least said first time segment.

12. The method of claim 11 wherein said read/write-enabling voltage level is equal to said first reference voltage.

13. The method of claim 11 wherein said read/write-enabling voltage level is more positive than said first reference voltage.

14. The method of claim 10 wherein said second reference voltage is more positive than said first reference voltage.

15. The method of claim 10 wherein a first drain node of said first transistor is electrically connected to a second drain node of said second transistor.

16. The method of claim 10 wherein a second source node of said second transistor is electrically floating.

17. The method of claim 10 wherein said first transistor is a FET acting as a memory pass gate.

18. The method of claim 10 wherein said second transistor is a FET acting as a memory storage.

19. The method of claim 10 wherein said first transistor and said second transistor are embedded on an ASIC chip using CMOS technology.

20. The method of claim 10 wherein said second transistor has a first storage capacitance associated with a junction of said second transistor and a second storage capacitance associated with an oxide layer of a second source node of said second transistor to store said data bit.

21. The method of claim 10 wherein said data bit is represented by a voltage level corresponding to said reference ground potential.

22. The method of claim 10 wherein said data bit is represented by a voltage level that is more positive than said reference ground potential.

23. A method for reducing leakage current when storing a data bit in an embedded DRAM cell, said method comprising:
    writing a data bit to a DRAM cell during a first time segment, and wherein said writing comprises applying a data bit voltage to said first source node of said first transistor during said first time segment and applying a read/write-enabling voltage level, with respect to said reference ground potential, to said first gate node of said first transistor during said first time segment and applying said read/write-enabling voltage level to said second gate node of said second transistor during at least said first time segment;
    applying a transistor disabling reference ground potential to a first gate node of a first transistor of said DRAM cell during a second time segment, said second time segment being after said first time segment;
    applying a first reference voltage, with respect to said reference ground potential, to a first source node of said first transistor during said second time segment; and
    applying a second reference voltage, with respect to said reference ground potential, to a second gate node of a second transistor during at least a portion of said second time segment.

24. A method for reducing leakage current when storing a data bit in an embedded DRAM cell, said method comprising:
    writing a data bit to a DRAM cell during a first time segment, and wherein said writing comprises applying a data bit voltage to said first source node of said first transistor during said first time segment and applying a read/write-enabling voltage level, with respect to said reference ground potential, to said first gate node of said first transistor during said first time segment and applying said read/write-enabling voltage level to said second gate node of said second transistor during at least said first time segment;
    applying a transistor disabling reference ground potential to a first gate node of a first transistor of said DRAM cell during a second time segment, said second time segment being after said first time segment;
    applying a first reference voltage, with respect to said reference ground potential, to a first source node of said first transistor during said second time segment, and wherein said read/write-enabling voltage level is equal to said first reference voltage; and applying a second reference voltage, with respect to said reference ground potential, to a second gate node of a second transistor during at least a portion of said second time segment.

25. A method for reducing leakage current when storing a data bit in an embedded DRAM cell, said method comprising:

writing a data bit to a DRAM cell during a first time segment, and wherein said writing comprises applying a data bit voltage to said first source node of said first transistor during said first time segment and applying a read/write-enabling voltage level, with respect to said reference ground potential, to said first gate node of said first transistor during said first time segment and applying said read/write-enabling voltage level to said second gate node of said second transistor during at least said first time segment;

applying a transistor disabling reference ground potential to a first gate node of a first transistor of said DRAM cell during a second time segment, said second time segment being after said first time segment;

applying a first reference voltage, with respect to said reference ground potential, to a first source node of said first transistor during said second time segment, and wherein said read/write-enabling voltage level is more positive than said first reference voltage; and applying a second reference voltage, with respect to said reference ground potential, to a second gate node of a second transistor during at least a portion of said second time segment.

26. A method for reducing leakage current when storing a data bit in an embedded DRAM cell, said method comprising:

writing a data bit to a DRAM cell during a first time segment;

applying a transistor disabling reference ground potential to a first gate node of a first transistor of said DRAM cell during a second time segment, said second time segment being after said first time segment;

applying a first reference voltage, with respect to said reference ground potential, to a first source node of said first transistor during said second time segment;

applying a second reference voltage, with respect to said reference ground potential, to a second gate node of a second transistor during at least a portion of said second time segment; and leaving a second source node of said second transistor electrically floating.

27. The method of claim 26 wherein said writing comprises:

applying a data bit voltage to said first source node of said first transistor during said first time segment;

applying a read/write-enabling voltage level, with respect to said reference ground potential, to said first gate node of said first transistor during said first time segment; and applying said read/write-enabling voltage level to said second gate node of said second transistor during at least said first time segment.

28. The method of claim 27 wherein said read/write-enabling voltage level is equal to said first reference voltage.

29. The method of claim 27 wherein said read/write-enabling voltage level is more positive than said first reference voltage.

30. The method of claim 26 wherein said second reference voltage is more positive than said first reference voltage.

31. The method of claim 26 wherein a first drain node of said first transistor is electrically connected to a second drain node of said second transistor.

32. The method of claim 26 wherein said first transistor is a FET acting as a memory pass gate.

33. The method of claim 26 wherein said second transistor is a FET acting as a memory storage.

34. The method of claim 26 wherein said first transistor and said second transistor are embedded on an ASIC chip using CMOS technology.

35. The method of claim 26 wherein said second transistor has a first storage capacitance associated with a junction of said second transistor and a second storage capacitance associated with an oxide layer of a second source node of said second transistor to store said data bit.

36. The method of claim 26 wherein said data bit is represented by a voltage level corresponding to said reference ground potential.

37. The method of claim 26 wherein said data bit is represented by a voltage level that is more positive than said reference ground potential.

* * * * *